US006943116B2

(12) United States Patent
Alsmeier et al.

(10) Patent No.: US 6,943,116 B2
(45) Date of Patent: Sep. 13, 2005

(54) METHOD FOR FABRICATING A P-CHANNEL FIELD-EFFECT TRANSISTOR ON A SEMICONDUCTOR SUBSTRATE

(75) Inventors: Johann Alsmeier, Radebeul (DE); Jürgen Faul, Radebeul (DE)

(73) Assignee: Infineon Technologies AG, Munich (DE)

(*) Notice: Subject to any disclaimer, the term of this patent is extended or adjusted under 35 U.S.C. 154(b) by 231 days.

(21) Appl. No.: 10/372,989

(22) Filed: Feb. 24, 2003

(65) Prior Publication Data

US 2005/0148178 A1    Jul. 7, 2005

(30) Foreign Application Priority Data

Feb. 22, 2002  (DE) ................................ 102 07 740

(51) Int. Cl.$^7$ ........................................ H01L 21/302

(52) U.S. Cl. .................... 438/694; 438/197; 438/217; 438/766; 438/775; 438/910; 438/918; 438/919

(58) Field of Search ............................. 438/197, 217, 438/694, 766, 775, 910, 918, 919

(56) References Cited

U.S. PATENT DOCUMENTS

| 5,629,221 A | * | 5/1997 | Chao et al. ................. 438/591 |
| 6,051,482 A | | 4/2000 | Yang |
| 6,093,661 A | * | 7/2000 | Trivedi et al. .............. 438/769 |

OTHER PUBLICATIONS

Y. Toyoshima et al.: "Novel Shallow Counter Doping Process and High Performance Buried Channel pMOSFET Using Boron Diffusion Through Oxide", *Symposium on VLSI Technology, May 28-30, 1991, Digest of Technical Papers*, pp. 111-112.

Z. J. Ma et al.: "Suppression of Boron Penetration in P$^+$ Polysilicon Gate P-MOSFET's Using Low-Temperature Gate-Oxide N$_2$O Anneal", *IEEE Electron Device Letters*, vol. 15, No. 3, Mar. 1994, pp. 109-111.

Richard B. Fair: :Physical Models of Boron Diffusion in Ultrathin Gate Oxides, *J. Electrochem. Soc.*, vol. 144, No. 2, 708-717.

* cited by examiner

*Primary Examiner*—George A. Goudreau
(74) *Attorney, Agent, or Firm*—Laurence A. Greenberg; Werner H. Stemer; Ralph E. Locher

(57) ABSTRACT

A p-channel field-effect transistor is formed on a semiconductor substrate. The transistor has an n-doped gate electrode, a buried channel, a p-doped source and a p-doped drain. The transistor is fabricated by a procedure in which, after an implantation for defining an n-type well, an oxidation is performed to form a gate-oxide layer and n-doped polysilicon is subsequently deposited. The latter is doped with boron or boron fluoride particles either in situ or by a dedicated implantation step. In a thermal process, the boron acceptors penetrate through the oxide layer into the substrate of the n-type well, where they form a p-doped zone, which serves for counter doping and sets the threshold voltage. This results in a steep profile that permits a shallow buried channel. The control of the number particles penetrating through the oxide layer is achieved by nitriding the oxide layer in an N$_2$O atmosphere.

9 Claims, 3 Drawing Sheets

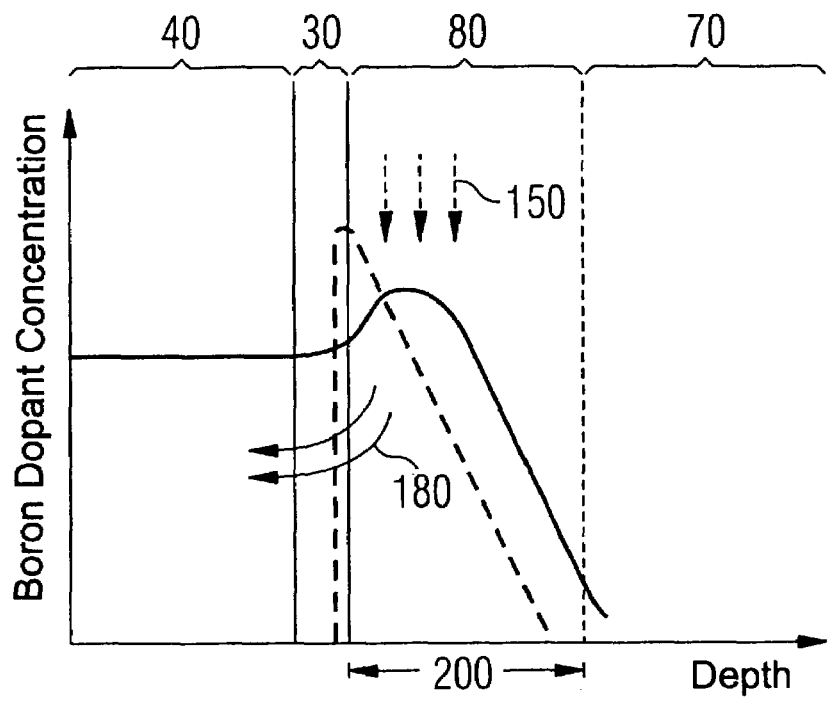
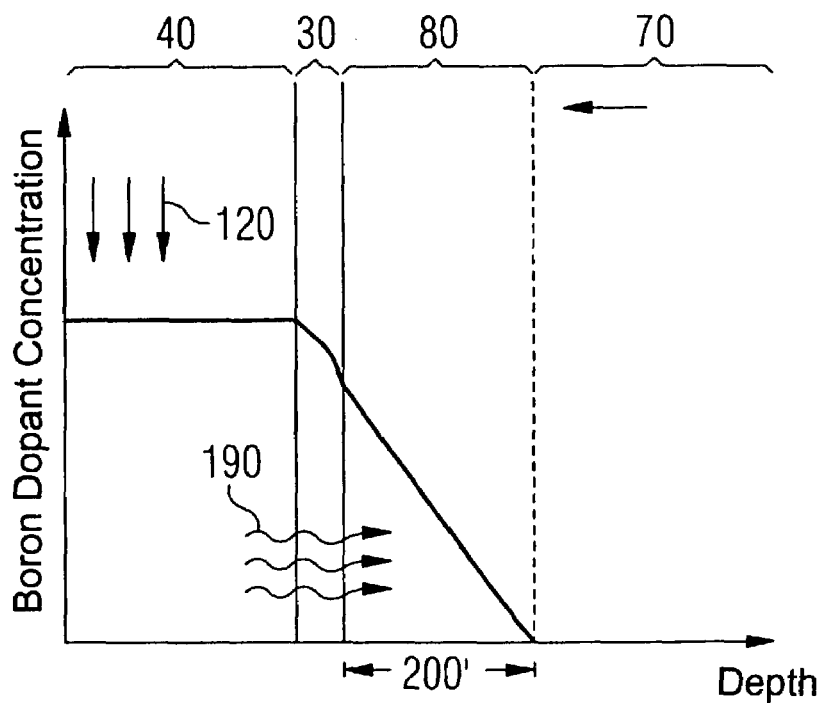

METHOD FOR FABRICATING A P-CHANNEL FIELD-EFFECT TRANSISTOR ON A SEMICONDUCTOR SUBSTRATE

BACKGROUND OF THE INVENTION

Field of the Invention

The invention relates to a method for fabricating a p-channel field-effect transistor on a semiconductor substrate, which has an n-doped gate electrode, a p-doped source region and a p-doped drain region.

In the fabrication of memory modules, in particular a dynamic memory (DRAM), the general endeavor as technology advances is to continuously reduce the feature sizes of the components of which the respective module is composed. The reason is for improved performance of the module and for lower process costs during the semiconductor fabrication. In the case of CMOS technology that is customarily used to fabricate circuits, both n-channel and p-channel field-effect transistors constitute the components that are fundamentally used together in a circuit. In order to keep down the costs for fabricating the memory modules, in this case the gate electrodes of both types are generally embodied with the same doping, for example an $n^+$-type doping in the gates formed as polysilicon. The corresponding fabrication methods are called single work function processes.

In contrast to this, however, it is possible, by additional processes, to form in each case different dopings of the gate electrodes for the respective types of field-effect transistors. Although this makes the fabrication more expensive, the respective circuits can be optimized as a result of this, so that these processes, called dual work function, are generally used for logic modules.

Accordingly, in the case of memory modules, by way of example, p-channel field-effect transistors are formed with $n^+$-doped gate electrodes. In this case, in order to set a desired threshold voltage of the p-channel field-effect transistor, it is necessary to carry out a counter doping with acceptors at the surface of the substrate below the gate oxide of the gate electrode—in the n-type well. This pushes the actual channel deeper into the substrate—a buried channel is produced.

The n-channel field-effect transistors that are likewise present on the memory module do not require this counter doping; they are operated with a surface channel.

In order to reduce feature sizes, i.e. the sizes of components, on a memory module, it is also necessary to shorten the vertical well profiles. The depth of the buried channel is likewise affected by this. In this case, however, the problem arises that boron atoms, for example, segregate into the gate oxide during an oxidation step following the implantation step required for the counter doping, and thus lead to a sharp drop in the particle density of boron atoms at the gate junction. In order to compensate for the drop in the particle number density that is necessary for setting the threshold voltage of the field-effect transistor, a higher dose is used in the implantation step for the counter doping, thereby increasing the depth of the buried channel in a disadvantageous manner. As a result, the effective gate oxide thickness also increases, however, so that the short channel behavior of the buried channel degrades in a disadvantageous manner. On account of the implantation profile produced by the segregation and diffusion, it is also difficult to realize a reduction of the vertical sizes of the p-channel field-effect transistor.

To date, a number of solutions have been proposed to enable a miniaturization of the buried channel scale. These include, by way of example, buried channel epitaxy for suppressing diffusion during brief thermal loading in order to obtain shallow buried channels or the use of antimony as a donor for so-called anti-punch implantation. The first solution leads to considerably increased costs, while problems with contaminants in the implantation apparatus can occur due to the second solution. Further solutions contain gate oxidation processes at low temperatures, which, however, have a disadvantageous influence on the retention time of the cell in a memory application due to the wet process baths associated therewith, or so-called strong halo implantation. An ion implantation through the gate oxide, i.e. a counter doping after the oxidation step, also leads to disadvantageous contaminants in the subsequent process steps.

SUMMARY OF THE INVENTION

It is accordingly an object of the invention to provide a method for fabricating a p-channel field-effect transistor on a semiconductor substrate that overcomes the above-mentioned disadvantages of the prior art methods of this general type, by which shallower buried channels are realized in the case of p-channel field-effect transistors, and no complicated and cost-propelling processes arise in this case.

With the foregoing and other objects in view there is provided, in accordance with the invention, a method for fabricating a p-channel field-effect transistor. The method includes the steps of providing a semiconductor substrate, doping the semiconductor substrate with donors by performing a first implantation for forming an n-doped well, carrying out a thermal oxidation for forming a thin oxide layer on a surface of the semiconductor substrate, nitriding the oxide layer in an $N_2O$ atmosphere to control a permeability of the oxide layer with respect to boron or boron fluoride particles penetrating through the oxide layer, depositing a first layer formed from n-doped polysilicon above the oxide layer, and p-doping the first layer with the boron or boron fluoride particles. A p-type dopant concentration of the particles is lower than an n-type dopant concentration of the first layer. A lithographic projection step and an etching step are carried out for removing the first layer in a first and a second region and for forming an n-doped gate electrode in a third region located between the first and second regions on the semiconductor substrate. The semiconductor substrate is doped with acceptors by performing a second implantation for forming a p-doped source region in the first region and a p-doped drain region in the second region in the semiconductor substrate. The semiconductor substrate is exposed to a temperature elevated to such an extent that a number of the particles migrate from the first layer through the oxide layer into the semiconductor substrate for forming a p-doped zone within the n-doped well for defining a threshold voltage of the field-effect transistor.

In accordance with the present invention, in the case of the p-channel field-effect transistor having the n-doped gate electrode and equivalently thereto the buried channel, the counter doping at the substrate surface of the n-type well is no longer achieved by an implantation step with boron or boron fluoride particles, as in the case of the prior art, before the deposition of the n-doped polysilicon in order to fabricate the gate electrode. Rather, what is carried out is a doping with boron or boron fluoride particles of the deposited layer. This is followed by a further step in which the particles penetrate—or diffuse—through the gate oxide layer to the substrate of the n-type well, where they produce a depth-dependent p-type doping profile. It has been found that the resulting p-type doping profile, e.g. of boron atoms, starting from the gate-substrate junction region, falls steeply in the vertical direction toward deeper regions and thus advantageously permits a significantly shallow channel region (buried channel). However, carrying out an additional implantation step with boron or boron fluoride particles before the deposition of the polysilicon layer is also not precluded by the present invention.

The step of diffusion of the boron or boron fluoride particles from the polysilicon layer of the gate electrode is made possible by exposing the semiconductor substrate to an elevated temperature. If the semiconductor substrate is a semiconductor wafer for fabricating multilayer integrated circuits, then a multiplicity of subsequent process steps that are carried out under elevated temperature conditions typically result. These include, in particular, plasma etching steps, furnace processes, baking steps during the resist coating of subsequent planes, etc. In this case, generally sufficiently high temperatures are achieved, so that the diffusion of the boron or boron fluoride particles suffices to bring about an accumulation of the particles in the substrate, e.g. silicon substrate. The advantage of using subsequent processes that are to be carried out anyway is that there is no need to carry out a separate thermal process, which leads to a cost saving.

On the other hand, it may be advantageous precisely to carry out a separate thermal process if defined temperature conditions have to be met in order to achieve a desired diffusion intensity, so that the desired doping profile is established.

The invention has the effect of establishing a vertical gradient of the p-type dopant concentration from the gate material, the polysilicon, through the gate oxide layer into the substrate. In a graphical representation, a steeply falling profile results for the region of the oxide layer and of the substrate. In accordance with the prior art, a diffusion or segregation of the boron takes place in the opposite direction, i.e. from a maximum value of the doping profile in the region of the substrate falling toward the gate oxide layer. The shallow doping profile in the region of this maximum leads to a disadvantageous deepening of the buried channel in the case of the method in accordance with the prior art.

In the case of CMOS technology, the boron or boron fluoride doping of the deposited layer of the polysilicon of the gate electrode can be carried out in a common step for p-channel and n-channel field-effect transistors. If this is not desirable, however, for example because the threshold voltages of the respective transistor types have to be set differently, then it is also possible, as an alternative, to provide doping masks for a separate doping of the polysilicon. The diffusion or penetration of the boron upon exposure to the elevated temperature then occurs only for the n-type well of the p-channel field-effect transistor. According to the invention, in particular boron, boron fluoride and also further substance compounds containing the element boron, such as $B_2H_6$, are suitable as starting substances for the p-doping of the n-doped polysilicon layer of the gate electrode.

The present invention results in a steeper p-type doping profile in the n-type well of the p-channel field-effect transistor. As a result of which the depth of the buried channel of the n-type well can also be reduced, so that overall the field-effect transistor can be embodied in small dimensions. The method steps according to the invention give rise to no significant additional costs or to any extra expenditure with respect to time.

According to the invention, two alternatives arise by which the p-doping of the polysilicon layer of the gate electrode can be carried out:

a). Boron or boron fluoride particles are added during the deposition of the first layer, i.e. the polysilicon, for the purpose of p-type doping. This may be made possible for example by admixing $B_2H_6$ with the silane in a CVD reactor. This advantageously obviates a doping step that has to be carried out separately after the deposition.

b). The p-doping of the first layer, i.e. the polysilicon, after the deposition of this layer is carried out by an implantation of boron or boron fluoride particles.

In field-effect transistors, the gate electrode is usually formed from a layer stack, for example containing the thin gate oxide layer, the polysilicon layer, a layer of conductive material, preferably a tungsten silicide, and, as insulating covering layer, a silicon nitride, insulating spaces often being added by lateral oxidation. The p-doping of the $n^+$-doped polysilicon is preferably effected during or after the deposition of the polysilicon layer, i.e. the two alternates mentioned, and in particular before the subsequent deposition of the tungsten silicide.

In a further refinement, before the first implantation in order to form the n-type well, a sacrificial oxide layer is formed, which is used as a screen oxide for improving the implantation properties, and the layer is removed again after the first implantation.

Advantageous refinements of the present invention result when using a dose of $10^{13}$ to $10^{15}$ particles per $cm^2$ for an implantation of the boron or boron fluoride particles into the polysilicon layer, and energy used for the particles of 2.5 to 10 keV.

According to a further refinement, the p-doping of the polysilicon layer with boron or boron fluoride is carried out in such a way that the polysilicon layer has a dopant concentration of $10^{17}$ to $10^{18}$ particles per $cm^2$, while the necessarily higher dopant concentration of the donors for forming the n-doped polysilicon gate electrode has $10^{19}$ to $10^{20}$ particles per $cm^2$.

According to the method, it is possible, in order to set a desired p-type doping profile for the counter doping in the n-type well during known subsequent processes with predetermined temperature conditions, to control the efficiency of the diffusion when exposing the substrate to the temperature by exposing the substrate with the gate oxide layer on its surface in an $N_2O$ atmosphere. This step is affected after the oxidation and before the deposition of the polysilicon layer. If the gate oxide layer is exposed in this way, then a nitriding of the oxide layer is affected, which influences the permeability of the oxide layer with respect to the boron or boron fluoride particles. Depending on the intensity of the nitriding, the permeability of the oxide layer is thereby reduced.

By contrast, if the step of exposing the semiconductor substrate to an elevated temperature is carried out separately, then the intensity of the diffusion of the boron or boron fluoride particles into the substrate can be achieved by way of the setting the temperature in this step.

In accordance with an added mode of the invention, there is the step of carrying out the p-doping of the first layer with the particles during the step of depositing the first layer. Alternatively, the p-doping of the first layer can be carried after the step of depositing the first layer by performing an implantation process.

In accordance with an additional mode of the invention, after the first implantation and before the depositing of the first layer, no p-doping of the semiconductor substrate with particles is carried out in order to form a doping profile within the n-doped well.

In accordance with a further mode of the invention, after the p-doping of the first layer with the particles, a second layer containing an electrically conductive material is deposited onto the first layer, and a third layer containing a nitride is deposited onto the second layer.

Other features which are considered as characteristic for the invention are set forth in the appended claims.

Although the invention is illustrated and described herein as embodied in a method for fabricating a p-channel field-effect transistor on a semiconductor substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2A is a graph illustrating a p-type doping profile resulting from a method for fabricating a p-channel field-effect transistor with an n-doped gate electrode in accordance with the prior art; and FIG. 2B is a graph illustrating the p-type doping profiles resulting from a method for fabricating a p-channel field-effect transistor with an n-doped gate electrode in accordance with the exemplary embodiment according to the invention.

DESCRIPTION OF THE PREFERRED EMBODIMENTS

Figure 1A:
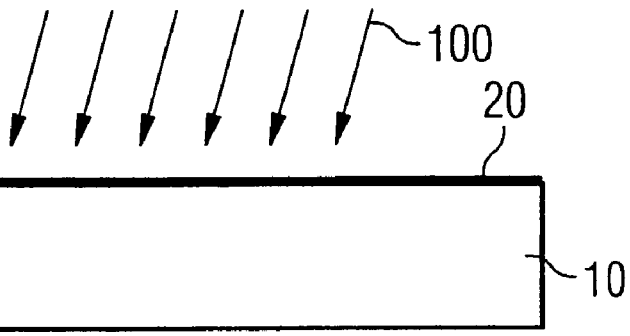
FIGS. 1A–1G are diagrammatic, sectional views illustrating an exemplary embodiment of the method according to the invention.
Figure 1B:
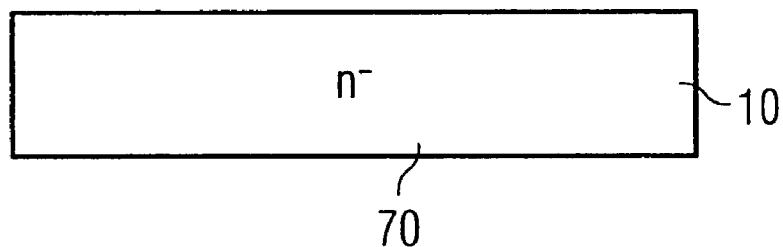

Referring now to the figures of the drawing in detail and first, particularly, to FIGS. 1A–1G thereof, there is shown a sequence of process steps in accordance with an exemplary embodiment of a method according to the invention. In this case, a p-channel field-effect transistor is advantageously formed on a semiconductor substrate 10 of a semiconductor wafer for the fabrication of memory modules, for instance DRAM modules. FIG. 1A shows a state in which a sacrificial oxide layer 20 is formed on the semiconductor substrate 10, which layer 20 is intended to improve the implantation properties of a subsequent doping step. First, a deep n-type well 70 of a field-effect transistor is formed by a mask being patterned on the semiconductor substrate by lithographic projection, holes being situated in the mask at the locations of the p-channel field-effect transistors to be formed. In a first implantation 100, the substrate 10 uncovered by the holes is doped with phosphorus and/or arsenic. After the first implantation 100, the sacrificial oxide layer 20 is removed (FIG. 1B).

Figure 1C:
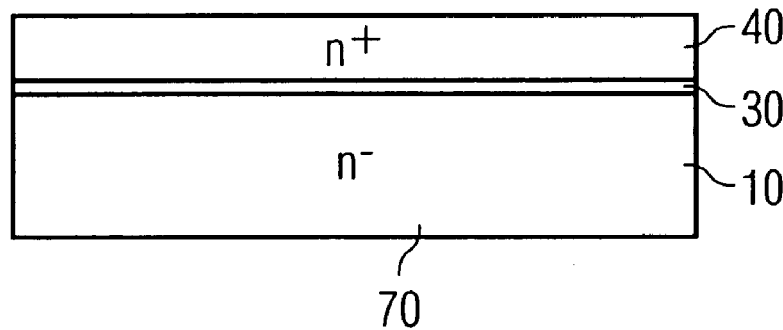

In accordance with an object of the present invention, in order to fabricate the memory modules, the patterning of gate electrodes is to be realized e.g. in accordance with cost-effective single work function processes. In the present example, n-doped gate electrodes are formed for the n-channel and p-channel field-effect transistors to be formed. In this case, in accordance with the prior art, a counter doping of the weakly n-doped substrate with boron atoms was carried out after the removal of the sacrificial oxide 20—if appropriate also before this. According to the present invention, this step can be omitted, and in the example, the method is continued by carrying out a thermal oxidation in order to form a thin gate oxide layer 30 on the substrate surface. In a chemical vapor deposition (CVD) process, a polysilicon layer heavily doped with arsenic and/or phosphorus is subsequently deposited as a first layer 40 (FIG. 1C).

Figure 1D:
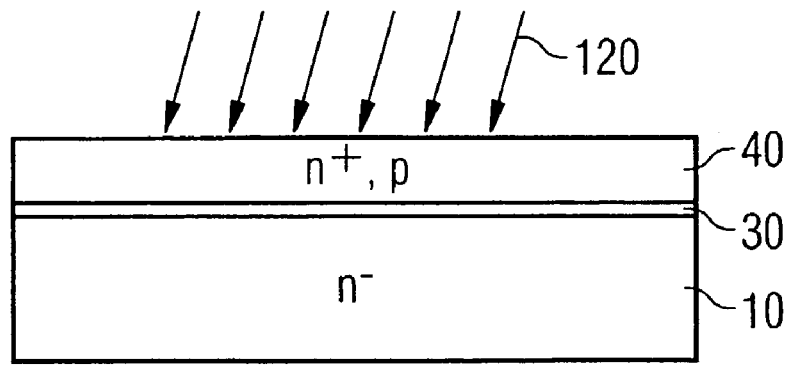

A counter doping of the superficial substrate region in the n-type well 70 that is necessary for setting the threshold voltage of the field-effect transistor is initiated by a second implantation 120. In this case, boron atoms are implanted into the polysilicon of the first layer 40 in order to produce a p-type doping which is weaker than the $n^+$-type doping by the phosphorus and/or arsenic atoms. The dopant concentration of the donors in the polysilicon is $10^{20}$ particles per $cm^2$, while the dopant concentration of the boron atoms as acceptors is $10^{18}$ particles per $cm^2$ (FIG. 1D).

Figure 1E:
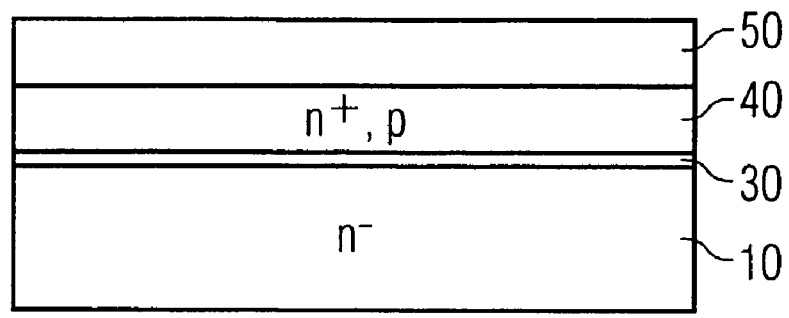
Figure 1F:
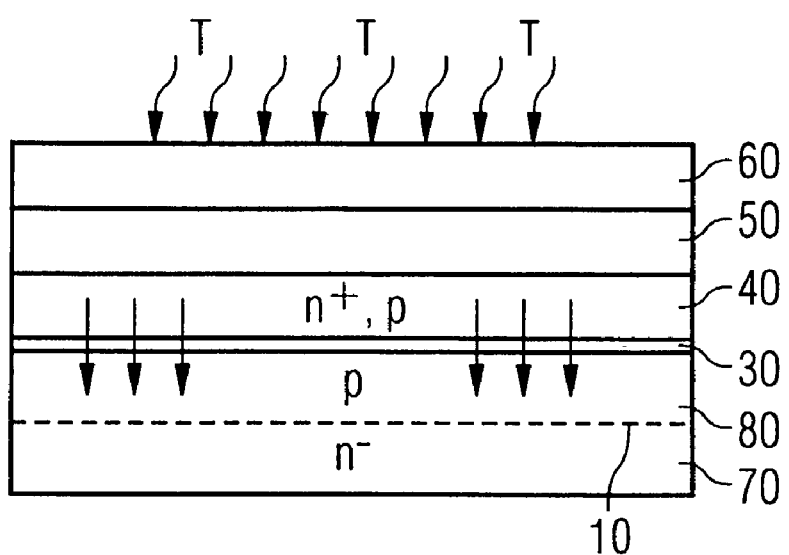
Figure 1G:
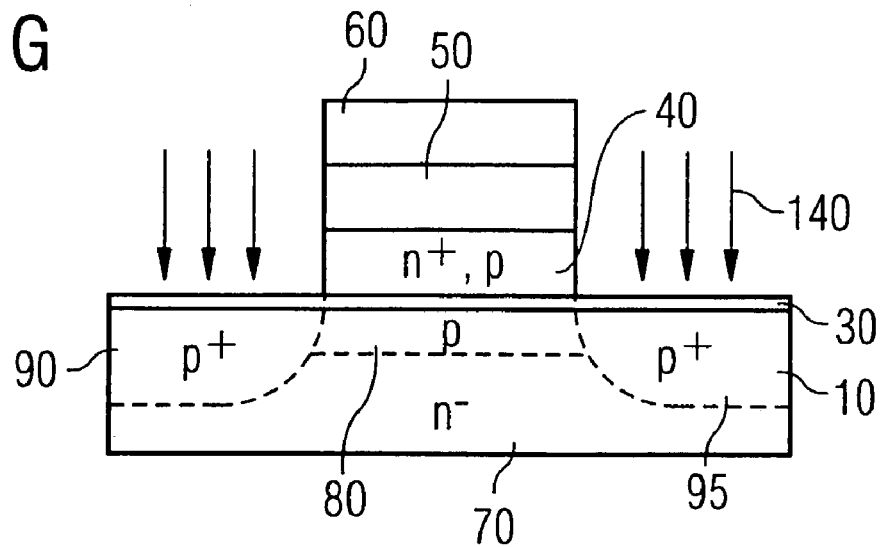

After the second implantation 120, a gate stack can be completed in layer engineering terms by depositing a tungsten silicide layer 50 as an electrically conductive material onto the polysilicon (FIG. 1E). A silicon nitride 60 is deposited thereon as an insulation layer (FIG. 1F).

In order to uncover the source and drain regions 90, 95 to be formed, the gate electrode containing the layer stack of polysilicon, tungsten silicide and silicon nitride is patterned in a further lithographic step. In order to uncover a first region for the source region 90 and a second region of the substrate surface for the drain region 95, plasma etching steps are respectively carried out in order to remove the silicon nitride, the tungsten silicide and the polysilicon. Furthermore, a heat treatment of the gate contact is necessary. Considerable temperatures occur during these processes, so that the boron atoms in the polysilicon, which have a comparatively high diffusivity under these temperatures, are excited to penetrate from the polysilicon of the first layer 40 through the oxide layer 30 into the substrate 10 in order to form a lightly p-doped zone 80.

In a further lithographic step, a perforated mask is applied in order to define the p-doped regions for the source and drain terminals of the p-channel field-effect transistors. By a third implantation 140, the uncovered substrate regions in the holes are implanted with boron fluoride, thereby forming a heavily p-doped source region 90 and a heavily p-doped drain region 95 for the p-channel field-effect transistor.

A comparison of the resulting doping profile in accordance with the prior art and in accordance with the present method is illustrated in FIGS. 2A and 2B. In the diagrams, the depth measured from the upper edge of the polysilicon layer is entered on the x axis, while the y axis shows the dopant concentration of the boron. The depth ranges assigned to the individual layers are depicted above the diagrams.

In FIG. 2A, which shows the profile in accordance with the prior art, the broken line shows the resulting profile which would be present directly after an implantation 150 with boron atoms onto the substrate before the oxidation. This profile, which is advantageous up to that point, degrades after the oxidation 180, the maximum situated at the junction between the gate stack and the substrate being attenuated by back diffusion of the boron atoms into the gate stack. In order to hold the level of the dopant concentration at the junction, therefore, a larger dose is implanted, which can be discerned as the solid line in FIG. 2A. A characteristic length 200 for the doping depth is comparatively increased as a result. The depth of the channel of the n-type well 70 is adversely affected as a result.

FIG. 2B shows the corresponding profile that arises in accordance with application of the method of the present invention. After the second implantation 120, i.e. the doping of the polysilicon with boron atoms or boron fluoride with an energy of 5 keV and a dose of $10^{14}$ ions per cm$^2$, a shallow doping profile for the dopant concentration of the boron is established in the region of the first layer, i.e. the polysilicon. If the step of exposure 190 to an elevated temperature is then performed, which can usually only begin with the etching processes for completing the gate electrode, the boron atoms diffuse or penetrate through the oxide layer 30 into the substrate 10 in order to form a p-doped zone. Within the substrate 10, the maximum of the profile of the dopant concentration is naturally situated precisely at the junction between the substrate 10 and the first layer 40 containing the polysilicon. A characteristic length 200' for the doping profile is therefore significantly smaller than in the above-mentioned case in accordance with the prior art.

We claim:

1. A method for fabricating a p-channel field-effect transistor, which comprises the steps of:
   providing a semiconductor substrate;
   doping the semiconductor substrate with donors by performing a first implantation for forming an n-doped well;
   carrying out a thermal oxidation for forming a thin oxide layer on a surface of the semiconductor substrate;
   nitriding the oxide layer in an N$_2$O atmosphere to control a permeability of the oxide layer with respect to one of boron and boron fluoride particles penetrating through the oxide layer;
   depositing a first layer formed from n-doped polysilicon above the oxide layer;
   p-doping the first layer with particles selected from the group consisting of boron particles and boron fluoride particles, a p-type dopant concentration of the particles being lower than an n-type dopant concentration of the first layer;
   carrying out a lithographic projection step and an etching step for removing the first layer in a first and a second region and for forming an n-doped gate electrode in a third region located between the first and second regions on the semiconductor substrate;
   doping the semiconductor substrate with acceptors by performing a second implantation for forming a p-doped source region in the first region and a p-doped drain region in the second region in the semiconductor substrate; and
   exposing the semiconductor substrate to a temperature elevated to such an extent that a number of the particles migrate from the first layer through the oxide layer into the semiconductor substrate for forming a p-doped zone within the n-doped well for defining a threshold voltage of the field-effect transistor.

2. The method according to claim 1, which comprises carrying out the p-doping of the first layer with the particles during the step of depositing the first layer.

3. The method according to claim 1, which comprises carrying out the p-doping of the first layer after the step of depositing the first layer by performing a third implantation process.

4. The method according to claim 1, wherein no p-doping of the semiconductor substrate with the particles in order to form a doping profile within the n-doped well is carried out after the first implantation and before the depositing of the first layer.

5. The method according to claim 1, which comprises after the p-doping of the first layer with the particles, performing the steps of:
   depositing a second layer containing an electrically conductive material onto the first layer; and
   depositing a third layer containing a nitride onto the second layer.

6. The method according to claim 1, which comprises before performing the first implantation, forming a sacrificial oxide layer and removing the sacrificial oxide layer after the first implantation is performed.

7. The method according to claim 3, which comprises carrying out the third implantation with a dose of $10^{13}$ to $10^{15}$ particles per square centimeter.

8. The method according to claim 7, which comprises carrying out the third implantation process with an energy of 2.5 to 10 keV.

9. The method according to claim 1, which comprises:
   forming the n-doped polysilicon of the first layer to have a dopant concentration of $10^{19}$ to $10^{20}$ particles per cubic centimeter; and
   carrying out the p-doping of the n-doped polysilicon with the particles such that the first layer has a dopant concentration of $10^{17}$ to $10^{18}$ particles per cubic centimeter.

\* \* \* \* \*